United States Patent [19]

Kahl

[11] Patent Number: 4,834,663

[45] Date of Patent: May 30, 1989

[54] DEVICE FOR TESTING CABLES PROVIDED WITH PLUGS

[76] Inventor: Helmuth Kahl, Fossbrink 2, 4952 Porta Westfalica, Fed. Rep. of Germany

[21] Appl. No.: 146,729

[22] Filed: Jan. 21, 1988

[30] Foreign Application Priority Data

Jan. 21, 1987 [DE] Fed. Rep. of Germany ....... 3701621

[51] Int. Cl.⁴ .............................................. H01R 9/09
[52] U.S. Cl. ................................... 439/132; 439/347; 439/372
[58] Field of Search ............... 439/132, 296, 347, 368, 439/372

[56] References Cited

U.S. PATENT DOCUMENTS

| 4,386,243 | 5/1983 | De Luca et al. .................... 439/347 |
| 4,590,540 | 5/1986 | Nicholson et al. ................. 439/296 |
| 4,643,501 | 2/1987 | Coffin ................................. 439/132 |

Primary Examiner—Joseph H. McGlynn
Attorney, Agent, or Firm—Michael J. Striker

[57] ABSTRACT

A device for testing cables provided with one or several plugs to detect possible connection defects and the like comprises an element receiving a plug and coupling the contacts of the plug with spring contacts, and a locking device for locking the plug in a recess of the coupling element. The locking device includes a holding pin, positionable by a pneumatically actuated piston laterally of the plug and movable transversely thereof to fix the plug in position.

21 Claims, 4 Drawing Sheets

DEVICE FOR TESTING CABLES PROVIDED WITH PLUGS

BAKGROUND OF THE INVENTION

The present invention relates to a device for testing a cable provided with one or several plugs to examine possible connection defects, to check continuity and the like.

Devices of the foregoing type are known. One of them has been disclosed in DE-PS No 33 38 770. In order to enable a reliable testing of the cable the plug inserted in a plug receiver of the coupling element is engaged by two resilient legs of the spring yoke of the locking device and is pulled against a stop or the base of the plug receiver and there brought to the position so that a canting of the plug is avoided.

The disadvantage of this conventional device resides in that the locking device is positioned directly below the base of the plug receiver so that the requirement that the spring contact, by which the locking of the cable with the plug is tested, should be pulled out from the coupling element, cannot be met.

Due to the ability of the spring contacts to move no spring forces of the stationary spacing contacts can be exceeded during the insertion of the plug into the plug receiver and difficultites arise when large multi-pole plugs are to be tested.

A further requirement resides in that with the aid of the insertion path of the spring contact into the plug up to contacting with the plug contact it should be examined whether a respective cable is correctly locked with the plug. This requirement is not, however, fulfilled in this known device.

Since the locking arrangement of the testing device of DE-PS No. 33 38 770 engages the plug with two resilient legs a reliable locking is particularly problematic when large and/or asymmetrical plugs are to be tested. The plug is always somewhat smaller than the plug receiver so that during the insertion of the plug into the receiver the plug may be canted and the required position of the plug would not be ensured.

SUMMARY OF THE INVENTION

It is an object of the present invention to provide an improved device for testing a cable-plug connection.

It is another object of the invention to provide a testing device in which the plug locked in the plug receiver would be freely accessible from the direction of the spring contacts and an absolutely rigid and reliable locking of large and/or asymmetrical plugs, even with an asymmetrical force distribution, in the plug receiver would be ensured.

These and other objects of the invention are attained by a device for testing a cable provided with one or a number of plugs to detect possible connection defects, continuity or the like, comprising a coupling element including plug-receiving means having a contour corresponding to that of a plug to be tested; and at least one locking means for locking the plug receiver in said plug-received means, said locking means being externally actuated for fixing said plug, pulling the plug into said coupling element to a stop, displacing the plug from said coupling element and releasing the plug after a testing process, said locking means being positioned laterally of said plug-receiving means.

A plurality of locking means may be provided, which are positioned at sides of said plug-receiving means.

The locking means may be actuated pneumatically, electrically or mechanically.

The locking means may include a holding pin movable transversely of a direction of an insertion of said plug into said plug-receiving means, and a piston movable in the direction parallel to the direction of the insertion, said holding pin being positioned on said piston and in an operative position extending into said plug-receiving means.

The piston is movable with a delay with respect to said holding pin.

The advantage of the testing device of this invention is that the space opposite to the insertion opening for the plug is free from disturbing structural components so that the spring contacts can be easily displaced in this region and also outside the coupling element. Also the insertion of the plug into the plug receiver is substantially facilitated.

Large and/or asymmetrical plugs, also in case of asymmetrical force distribution, can be easily tested by arranging several locking devices, at the sides of the plug receiver, wherein, for example two locking devices can be positioned diametrically opposite each other or at a predetermined angular position relative to each other.

A further advantage of the testing device according to the invention resides in that due to a very precise insertion of the plug to a predetermined end position and the ability of the spring contacts to be moved below the plug receiver the path of insertion of the respective spring contact into the plug up to the contacting with the cable can be measured. By comparison of the measured value with the desired value it can be determined whether the correct locking of the cable with the plug exists or whether this connection is incorrect and the cable should be pulled out from the plug by the spring contact.

The locking means may further include a compression spring, said holding pin and said piston being loadable with pressure air against a direction of action of said spring, said piston having a bore which acts as a throttle.

The holding pin may be pivotally connected to said piston.

The locking means may further include a cylinder housing and a ring inserted in said cylinder housing and receiving a portion of said piston, and a compression spring supported between an end face of said ring and a flange formed on said piston.

Two stop pins may be provided on said ring for limiting a pivoting motion of said holding pin, said stop pins being spaced from each other by a distance greater than a width of said holding pin.

The piston may be formed with an oblong hole, said ring including a stop pin inserted into said oblong hole and guided therein, said oblong hole extending in a direction of a stroke of said piston.

The cylinder housing may have a longitudinal opening and said ring has a longitudinal opening, said housing pin extending through said longitudinal openings towards said plug-receiving means.

The locking means may include a locking element provided on said piston and including a cam track, a stationary guide pin inserted in said cam track so that said locking element is guided along said cam track.

The holding pin may be arranged in said locking element.

The holding pin may be spring-biased in said locking element.

The locking means may include a cylinder receiving said piston and carrying a pivot axle thereon, said cylinder, said piston and said locking element being pivotable about said axle.

The piston may be double-acting piston.

The holding pin may be formed as a disc eccentrically connected to said piston, said piston having a rod connected to a wider side of said disc, said locking means further including a sleeve receiving said rod and including a cam track, said rod being provided with a guide pin guided in said cam track.

The locking means may include a threaded sleeve, said piston being threaded and received in said sleeve for a movement therein.

The cam track may be shaped so that said holding pin in an operative position first moves horizontally, then nearly horizontally and then vertically or nearly vertically.

The novel features which are considered as characteristic for the invention are set forth in particular in the appended claims. The invention itself, however, both as to its construction and its method of operation, together with additional objects and advangtages thereof, will be best understood from the following description of specific embodiments when read in connection with the accompanying drawings.

DETAILED DESCRIPTION OF THE PREFERRED EMBODIMENTS

Figure 1:
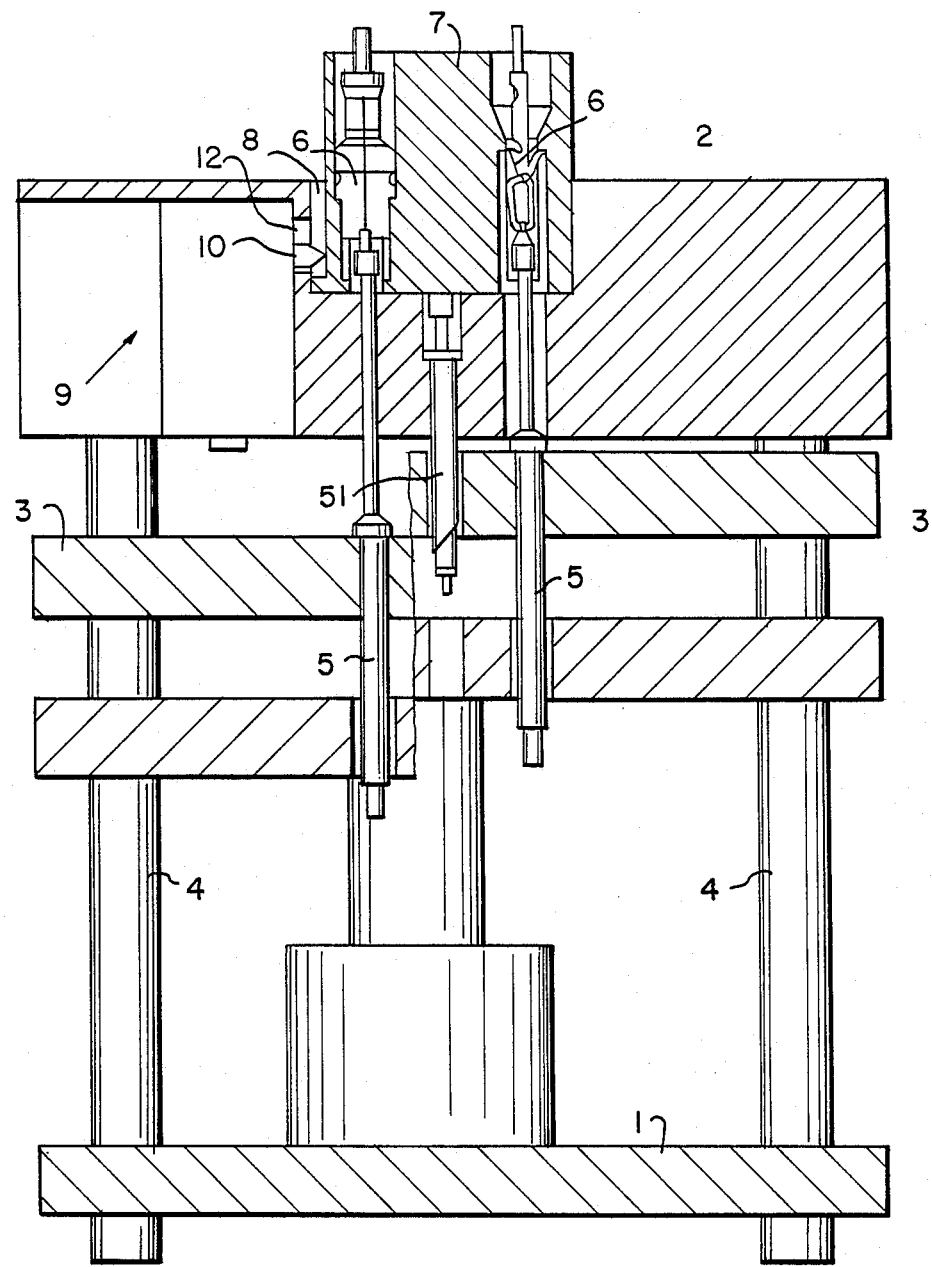
FIG. 1 is an elevational sectional view of the device of the invention in different operation positions.

Referring now to the drawings in detail, and firstly to FIG. 1 thereof, it will be seen that the device for examining cables is comprised of a base plate 1, a coupling element 2 extending parallel to base plate 1, a slide piece formed as a support plate 3 and positioned between base plate 1 and coupling element 2, and guide bars 4 which are parallel to each other and spaced from each other and connecting the base plate 1 and the coupling element 2 to each other. The support plate 3 is adjustably securable on the guide bars 4 as well as two spring contacts 5 inserted in and connected to the support plate 3. Spring contacts 5 penetrate into the coupling element 2.

Spring contacts 5 contact at the upper ends thereof respective plug contacts 6 of a plug 7 which is inserted in a plug receiving recess 8 of the coupling element 2.

According to the invention, a locking device 9 is provided at the side of the plug receiving recess 8. The locking device includes a holding or locking pin 10 having a tip or apex. Pin 10 is movable in the direction transverse to the direction of the insertion of the plug 7.

Figure 2:
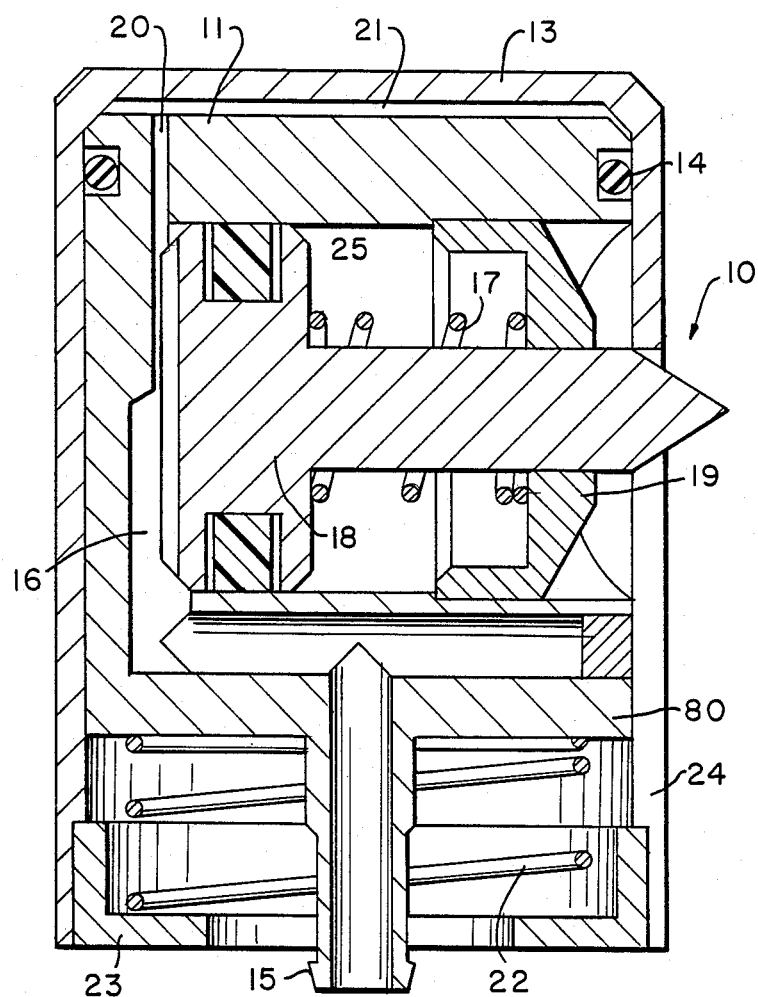
FIG. 2 is a sectional view through a locking device according to a first embodiment.

As clearly seen in FIG. 2 the holding pin 10 is positioned in a piston 11 which is movable parallel to the direction of the insertion of plug 7. The holding pin 10 is guided in an oblong hole 12 (FIG. 1) provided in the side wall formed at the plug receiving recess. The length of the hole 12 corresponds to the track by which the plug 7 is pulled by the locking device into the plug receiver 8.

Referring back to FIG. 2 it is seen that the locking device is formed substantially as a press-pull-cylinder and is pneumatically actuated. The holding pin 10 arranged in piston 11 is movable transversely of the axis of elongation of piston 11. Piston 11 is sealed against a cylinder housing 13 surrounding the piston by a seal 14. An air connection 15 through which air can enter the interior of piston 11 and flow away from the latter is provided in the bottom of piston 11.

The mode of operation of the locking device is as follows:

When pressure air is supplied via air connection 15 it enters the interior of piston 11. The holding pin 10 has a flange or abutment 18 at the end opposite to the tip of the pin. Between the piston wall and abutment 18 is formed a chamber 16 on which pressure acts on the face of the abutment 18 and moves the holding pin 10 against the force of a compression spring 17 provided on the holding pin 10. Spring 17 at one end thereof is supported against the wall of abutment 18 opposite to chamber 16, and at the other end thereof, in a recess of a ring 19 which serves to guide the holding pin 10. Thereby the top or head of the holding pin 10 moves into the outer wall of the plug housing as shown in FIG. 1.

Bore 20 (FIG. 3) which forms the connection between chamber 16 and a piston chamber 21 acts as a throttle so that pressure is built up with delay firstly in the piston chamber 21 which is formed by the end face of piston 11 and the respective inner surface of the cylinder housing 13, then the pressure is built up when the holding pin 10 is pressed outwardly. Then piston 11 is moved downwardly against the force of a spring 23 which is supported between the piston wall 80 formed in the region of air connection 15 and a cover 23 of the cylinder housing 13.

In order to release this position air is removed from piston 11 so that the holding pin is firstly moved by the force of compression spring 17 in the direction of abutment 18 and then, due to the delay by means of bore 20, piston 11 is moved upwardly by compression spring 22.

In order to secure the holding pin 10 against rotation a longitudinal opening 24 is formed in the cylinder housing 13. The tip of the holding pin 10 penetrates the guide opening 24. Piston 11 as well as holding pin 10 are sealed in the known manner against air losses by seals 25, 14.

Figure 5:
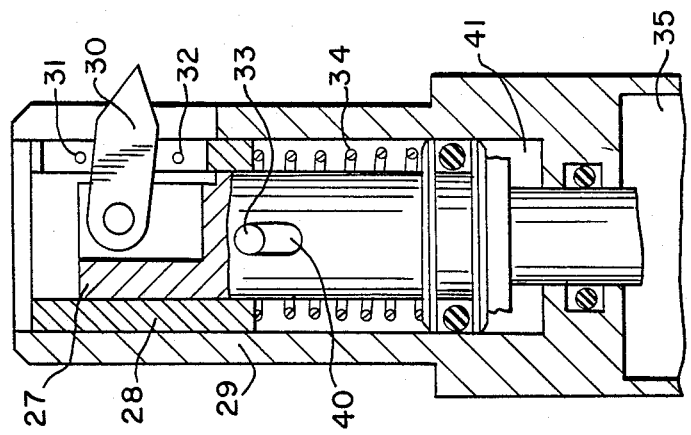
FIGS. 3 to 5 are axial sectional view of a further embodiment of the locking device of the cable examining device of this invention, in different positions.
Figure 4:
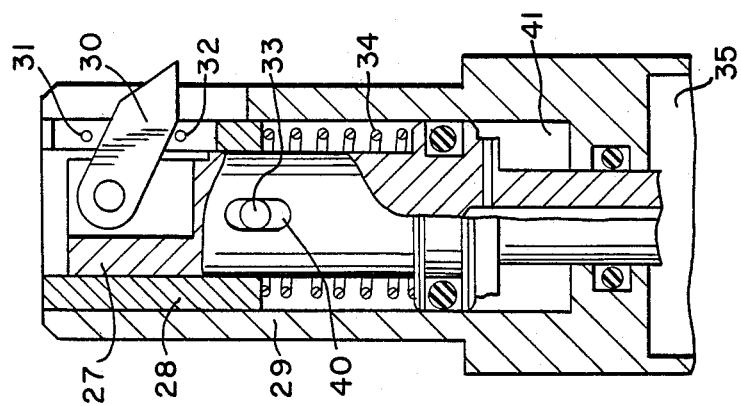
Figure 3:
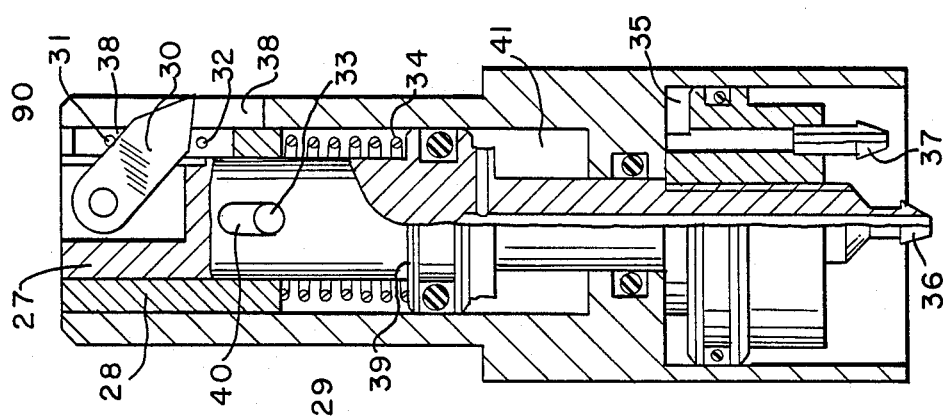

FIGS. 3 to 5 illustrate another embodiment of the locking device. The locking device includes a cylinder housing 29 in which a pneumatically actuated piston 27 is guided, to the end of which, facing away from air connections 36, 37, a holding pin 30 is pivotally connected. Between the cylinder housing 29 and piston 27 is provided in the upper region of the cylinder, a ring 28 which has a longitudinal opening 90 which is in connection with a longitudinal opening 38 formed in the cylinder housing 28. Both openings 90 and 38 are penetrated by the holding pin 30 the end of which projecting outwardly is formed as a tip. Stops 31 and 32 are provided in the wall of ring 28 in the region of opening 90. Holding pin 30 is movable between these stops 31 and 32.

FIG. 3 illustrates an initial position of the locking device, in which position the device is yet non-operative. Upon the application of pressure air through the air connection 37, air flows into chamber 35 and loads the piston surface with pressure; piston 27 is thus pulled downwardly. The holding pin 30 thus is supported against the stop or pin 32 and pivots from its position inclinded at an acute angle to the vertical, to the horziontal or almost horizontal position. By means of a compression spring 34 which is positioned between ring 28 and an abutment or flange 39 of piston 27 and guided on the latter, ring 28 is firstly held in its uppermost end position. While piston 27 is moved downwards the compression spring 34 is relaxed. Ring 28 is provided with a stop pin 33. This stop pin 33 is inserted in an oblong hole 40 formed in the piston 27. During the movement of piston 27 in the downward direction this piston also displaces hole 40 relative to the stop pin 33. If piston 27 travels downwards so far that the compression spring relaxes the pin 33 is positioned approximately in the middle region of oblong hole 40. This position is illustrated in FIG. 4. At the same time, the tip of the holding pin 30 digs into the wall of the housing of the plug 7. If piston 27 is lowered further the stop pin 32 reaches its upper end position in the oblong hole 40 so that ring 28 is also pulled downwardly. This means that the holding pin 30 is moved from its vertical position. This position is shown in FIG. 5. At least two locking devices of this embodiment can be employed such that the line of the force of the holding pin 30 would lie approximately in the region of the middle axis of the plug. It is understandable that the locking device completely functions when it is merely brought to operation.

In order to displace and release the plug air should be applied through the air connection 36 so that pressure would act on the piston surface in a chamber 41. This pressure would move piston 27 together with ring 28 and holding pin 30 in the upward direction. Upon reaching the end position of the ring 28, the piston 27 will travel further in the upward direction and also under the compression of spring 34. The holding pin 30 will strike against the stop of pin 31 and will release the plug 7 whereas piston 27 will be limited in its uppermost position since the pin 23 is supported in the end position in the hole 40.

Figure 6:
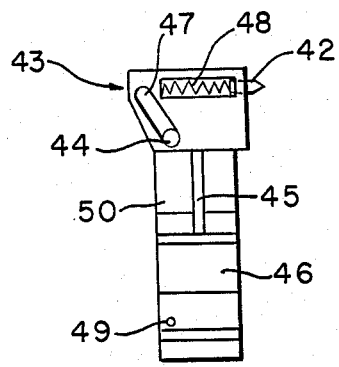
FIG. 6 is a side view of the locking device of yet another embodiment.

FIG. 6 illustrates yet another embodiment of the locking device which includes a double-acting pneumatic cylinder 46 the piston 45 of which has a piston rod to which a locking element 43 is connected. A holding pin 42 is movably positioned in the locking element 43. The latter has a cam track 47 in which a guide pin 44 is guided. The guide pin 44 is stationary and is connected to the plate 50 which has a pivot axle 49 about which cylinder 46 can rotate.

If, upon the loading of piston 45 with pressure air, it has been pulled downwardly, the locking element 43 performs the necessary horizontal and vertical movements for engaging in the plug 8 and locking the same in the plug receiver 8. These motions of the locking element 4 depend upon the shape of the cam track 47. Cylinder 46 and the piston rod of piston 45 and locking element 43 will pivot about the pivot axle 49.

In order to release the locking element 43 from its locking position, the pressure air supply into cylinder 46 is changed so that piston 45 together with the locking element 43 will move upwardly and will release the plug 71. Tolerances of the plug housing can be compensated for by a compression spring 48 by means of which the holding pin 42 is biased.

Holding pins 10, 30, 42 can engage and hold the plug 7 in a form-locking, force-locking or friction-locking manner whereby the shape of the tip of the holding pin can be correspondingly adjusted.

As seen in FIG. 1, the contact for the actuation of the locking device is released by a switching pin 51 which extends parallel to the spring contacts 5 and is secured in the coupling element 2. Thereby the switching pin 51 extends into the interior of the plug receiver 8 and is pressed, upon the insertion of the plug 7, downwardly so that the actuation of the locking device takes place in the above described manner. First, the holding pins 10, 30, 42 of one or, respectively, several locking devices engage the plug 7 so that the latter can be, without changing its position, for example by canting, pulled to the base of the plug receiver 8 which is here formed by the recess. Then spring contacts 5 travel into respective openings of the plug 7 for examining or testing of the plug contacts 6. FIG. 1 illustrates this testing position in which plug 7 lies on the base of the plug receiving recess 8 which also receives the locking device 9 which is in its lowermost position.

Figure 7:
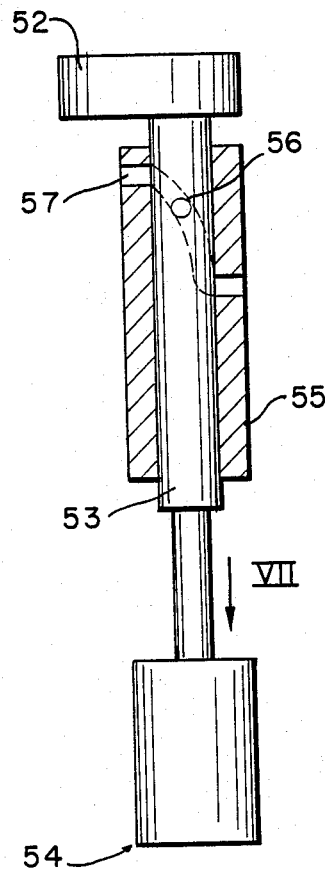
FIG. 7 is a partial sectional view of still another embodiment of the locking device.

The embodiment shown in FIG. 7 includes the holding pin 52 which is formed as an eccentric disc. The path of movement of the eccentric disc 52 is defined by a cam track 57 which is provided in a stationary guide sleeve 55. A piston 53 connected with the holding pin 52 is guided in the sleeve 55. Piston 53 is securd in a pneumatically actuated cylinder 54 and has a guide pin 56 which is guided in the cam track 57.

The rod of the piston 53 is fixed to the wider side of the holding disc 52. Due to a respective shape of the cam track 57, the holding disc 52, upon the lowering of the piston 53 in the direction of arrow VII, is brought to the position in which it engages the non-shown plug 7. A further movement of the piston 53 and holding disc 52 is defined by the cam track 57 so that an approximately vertical movement of the piston rod, holding disc 52 and thus plug 7 results which would bring the plug to the end position within the plug receiver 8.

In addition to the embodiment of FIG. 7 in which the movements of the holding disc are defined by the cam track the piston rod can be provided with a thread and be guided in a threaded sleeve, by means of which, depending on the pitch of the thread different horizontal and vertical tracks of movement can be achieved.

It will be understood that each of the elements described above, or two or more together, may also find a useful application in other types of plug testing devices differing from the types described above.

While the invention has been illustrated and described as embodied in a plug testing device, it is not intended to be limited to the details shown, since various modifications and structural changes may be made without departig in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim

1. A device for testing a cable provided with one or a number of plugs to detect possible connection defects, continuity or the like, comprising a coupling element including plug-receiving means having a contour corresponding to that of a plug to be tested; and at least one locking means for locking the plug received in said plug-received means, said locking means being externally actuated for fixing said plug, pulling the plug into said coupling element to a stop, displacing the plug from said coupling element and releasing the plug after a testing process, said locking means being positioned laterally of said plug-receiving means.

2. The device as defined in claim 1, wherein a plurality of locking means are provided, which are positioned at sides of said plug-receiving means.

3. The device as defined in claim 1, wherein said locking means is pneumatically actuated.

4. The device as defined in claim 3, wherein said locking means include a holding pin movable transversely of a direction of an insertion of said plug into said plug-receiving means, and a piston movable in the direction parallel to the direction of the insertion, said holding pin being positioned on said piston and in an operative position extending into said plug-receiving means.

5. The device as defined in claim 4, wherein said piston is movable with a delay with respect to said holding pin.

6. The device as defined in claim 4, said locking locking means further including a compression spring, said holding pin and said piston being loadable with pressure air against a direction of action of said spring, said piston having a bore which acts as a throttle.

7. The device as defined in claim 4, wherein said holding pin is pivotally connected to said piston.

8. The device as defined in claim 7, said locking means further including a cylinder housing and a ring inserted in said cylinder housing and receiving a portion of said piston, and a compression spring supported between an end face of said ring and a flange formed on said piston.

9. The device as defined in claim 8, wherein two stop pins are provided on said ring for limiting a pivoting motion of said holding pin, said stop pins being spaced from each other by a distance greater than a width of said holding pin.

10. The device as defined in claim 8, wherein said piston is formed with an oblong hole, said ring including a stop pin inserted into said oblong hole and guided therein, said oblong hole extending in a direction of a stroke of said piston.

11. The device as defined in claim 10, wherein said cylinder housing has a longitudinal opening and said ring has a longitudinal opening, said holding pin extending through said longitudinal openings towards said plug-receiving means.

12. The device as defined in claim 4, wherein said locking means include a locking element provided on said piston and including a cam track, a stationary guide pin inserted in said cam track so that said locking element is guided along said cam track.

13. The device as defined in claim 12, wherein said holding pin is arranged in said locking element.

14. The device as defined in claim 13, wherein said holding pin is spring-biased in said locking element.

15. The device as defined in claim 13, wherein said locking means include a cylinder receiving said piston and carrying a pivot axle thereon, said cylinder, said piston and said locking element being pivotable about said axle.

16. The device as defined in claim 15, wherein said piston is a double-acting piston.

17. The device as defined in claim 4, wherein said holding pin is formed as a disc eccentrically connected to said piston, said piston having a rod connected to a wider side of said disc, said locking means further including a sleeve receiving said rod and including a cam track, said rod being provided with a guide pin guided in said cam track.

18. The device as defined in claim 4, wherein said locking means include a threaded sleeve, said piston being threaded and received in said sleeve for a movement therein.

19. The device as defined in claim 17, wherein said cam track is shaped so that said holding pin in an operative position first moves horizontally, then nearly horizontally and then vertically or nearly vertically.

20. The device as defined in claim 1, wherein said locking means is electrically actuated.

21. The device as defined in claim 1, wherein said locking means is mechanically actuated.

* * * * *